US006278174B1

(12) United States Patent
Havemann et al.

(10) Patent No.: US 6,278,174 B1
(45) Date of Patent: *Aug. 21, 2001

(54) INTEGRATED CIRCUIT INSULATOR AND STRUCTURE USING LOW DIELECTRIC INSULATOR MATERIAL INCLUDING HSQ AND FLUORINATED OXIDE

(75) Inventors: Robert H. Havemann, Garland; Manoj K. Jain, Plano, both of TX (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/845,340

(22) Filed: Apr. 25, 1997

Related U.S. Application Data

(63) Continuation-in-part of application No. 08/234,100, filed on Apr. 28, 1994, now Pat. No. 5,565,384.
(60) Provisional application No. 60/016,403, filed on Apr. 29, 1996.

(51) Int. Cl.[7] .............................. H01L 23/58; H01L 29/00
(52) U.S. Cl. .......................... 257/637; 257/524; 438/623
(58) Field of Search .................................. 257/637, 642, 257/643, 647, 524; 438/623

(56) References Cited

U.S. PATENT DOCUMENTS

| | | | |
|---|---|---|---|
| 5,073,814 | * 12/1991 | Cole, Jr. et al. | 257/643 |
| 5,338,975 | * 8/1994 | Cole, Jr. et al. | 257/750 |
| 5,506,177 | * 4/1996 | Kishimoto et al. | 438/624 |
| 5,530,293 | * 6/1996 | Cohen et al. | 257/752 |
| 5,565,384 | * 10/1996 | Havemann | 438/623 |
| 5,616,959 | * 4/1997 | Jeng | 257/758 |
| 5,661,344 | * 8/1997 | Havemann et al. | 257/758 |
| 5,717,232 | * 2/1998 | Inoue et al. | 257/283 |
| 5,864,172 | * 1/1999 | Kapoor et al. | 257/634 |
| 5,886,410 | * 3/1999 | Chiang et al. | 257/759 |
| 5,998,303 | * 12/1999 | Sato | 438/758 |

OTHER PUBLICATIONS

Gutmann et al., "Low Dielectric Constant Polymers for On-Chip Interlevel Dielectrics with Copper Metalization", Mat. Res. Soc. Symp. Proc., vol. 381, pp. 177–195, Apr. 17, 1995.*

Laxman, Ravi K., "Low E Dielectrics: CVD Fluorinated Silicon Dioxides", Semiconductor International, vol. 18, pp. 71–74, May 1995.*

Lu, T.-M. et al. (Eds), "Low–Dielectric Constant Materials—Synthesis and Applications in Microelectronics", Materials Research Society Symposium Proceedings, vol. 381, p. 184, Apr. 1995.*

* cited by examiner

Primary Examiner—Olik Chaudhuri
Assistant Examiner—Howard Weiss
(74) Attorney, Agent, or Firm—Calton H. Hoel; Wade James Brady, III; Frederick J. Telecky, Jr.

(57) ABSTRACT

An intermetal level dielectric with two different low dielectric constant insulators: one for gap filling (140) within a metal level and the other (150) for between metal levels. Preferred embodiments include HSQ (140) as the gap filling low dielectric constant insulator and fluorinated silicon oxide (150) as the between metal level low dielectric constant insulator.

9 Claims, 10 Drawing Sheets

INTEGRATED CIRCUIT INSULATOR AND STRUCTURE USING LOW DIELECTRIC INSULATOR MATERIAL INCLUDING HSQ AND FLUORINATED OXIDE

CROSS REFERENCE TO PRIOR APPLICATIONS

This application is a continuation-in-part of Ser. No. 08/234,100, filed Apr. 28, 1994 now U.S. Pat. No. 5,565,384, and issued Oct. 15, 1996 and claims priority under 35 U.S.C. §119(e)(1) based upon provisional application Ser. No. 60/016,403, filed Apr. 29, 1996.

The invention relates to semiconductor devices, and, more particularly, to integrated circuit insulation and methods of fabrication.

Integrated circuits typically include field effect transistors with source/drains formed in a silicon substrate and insulated gates on the substrate together with multiple overlying metal (or polysilicon) interconnections formed in levels. An insulating layer lies between the gates/sources/drains and the interconnections formed from the first metal level (premetal dielectric) and also between successive metal levels (intermetal-level dielectric). Vertical vias in the insulating layers filled with metal (or polysilicon) provide connections between interconnections formed in adjacent metal levels and also between the gate/source/drain and the first metal level interconnections. Each insulating layer must cover the relatively bumpy topography of the interconnections of a metal level or the gates, and this includes crevices between closely spaced interconnects in the same metal level. Also, the dielectric constant of the insulating layer should be as low as practical to limit capacitive coupling between closely spaced interconnects in the same metal level and in adjacent overlying and underlying metal levels.

Various approaches form silicon dioxide (oxide) insulating layers over bumpy topography: reflowing deposited borophosphosilicate glass (BPSG), using spin-on glass (SOG), sputtering while depositing in plasma enhanced chemical vapor deposition (PECVD) with tetraethoxysilane (TEOS) plus oxygen as source gasses, etching back a stack of deposited glass plus spun-on planarizing photoresist, and chemical-mechanical polishing (CMP) deposited oxide.

All these oxide approaches have problems including the relatively high dielectric constant of silicon oxides: roughly 3.9–4.2. This limits how closely the interconnections can be packed and still maintain a low capacitive coupling.

Laxinan, Low ∈Dielectrics: CVD Fluorinated Silicon Dioxides, 18 Semiconductor International 71 (May 1995), summarizes reports of fluorinated silicon dioxide for use as an intermetal level dielectric which has a dielectric constant lower than that of silicon dioxide. In particular, PECVD using silicon temfluoride ($SiF_4$), silane ($SiH_4$), and oxygen ($O_2$) source gasses can deposit $SiO_xF_y$ with up to 10% fluorine and a dielectric constant in the range 3.0 to 3.7. But this dielectric constant still limits the packing density of interconnections. Alternatives sandwich the fluorinated oxide between layers of conformally deposited silicon dioxide.

Organic polymer insulators provide another approach to low dielectric constant insulators. Formation by vapor deposition ensures filling of crevices between closely spaced interconnections. For example, parylenes are thermoplastic polymers that have low water affinity, and may be conformally deposited from a vapor without solvents and high temperature cures. Parylene with hydrogen on the aliphatic carbons may be used at temperatures up to about 400° C. under an $N_2$ atmosphere, whereas aliphatic perfluorination increases the useful temperature to about 530° C. However, these conformal depositions must be planarized, and typically the polymer is etched back and a planaing silicon oxide deposition is applied over the polymer.

Lastly, a sort of hybrid of polymers and spin-on-glasses, hydrogen silsesquioxane (HSQ), may be spun-on and cured to yield an insulator with dielectric constant about 3.0. Indeed, first deposit a conformal coat of silicon oxide (such as PECVD of TEOS) over bumpy topography, then spin on HSQ to fill in the gaps for planarity, cure the HSQ, and finally deposit a cap layer of oxide. The HSQ has good gap filing capabilities but can potentially crack for thick films, e.g., roughly 1 μm. Thus the cap layer of oxide may be relatively thick. However, the HSQ/cap oxide structure has an effective dielectric constant much higher than tat of pure HSQ, and some of the benefit of the HSQ is lost.

SUMMARY OF THE INVENTION

The present invention provides an intermetal level dielectric or premetal level dielectric structure with two (or more) low dielectric constant insulating materials: one material for gap filling and the other material for filling up to an overlying metal level.

Preferred embodiments use gap filling with spin on materials such as HSQ together with level filling materials such as PECVD fluorinated oxide.

Advantages include an insulating structure having a low effective dielectric constant which makes use of a good gapfilling low-dielectric-constant material having limitations such as cracking of thick layers.

BRIEF DESCRIPTION OF THE DRAWINGS

The drawings are schematic for clarity.

DESCRIPTION OF THE PREFERRED EMBODIMENTS

First Preferred Embodiment

Figure 1A:
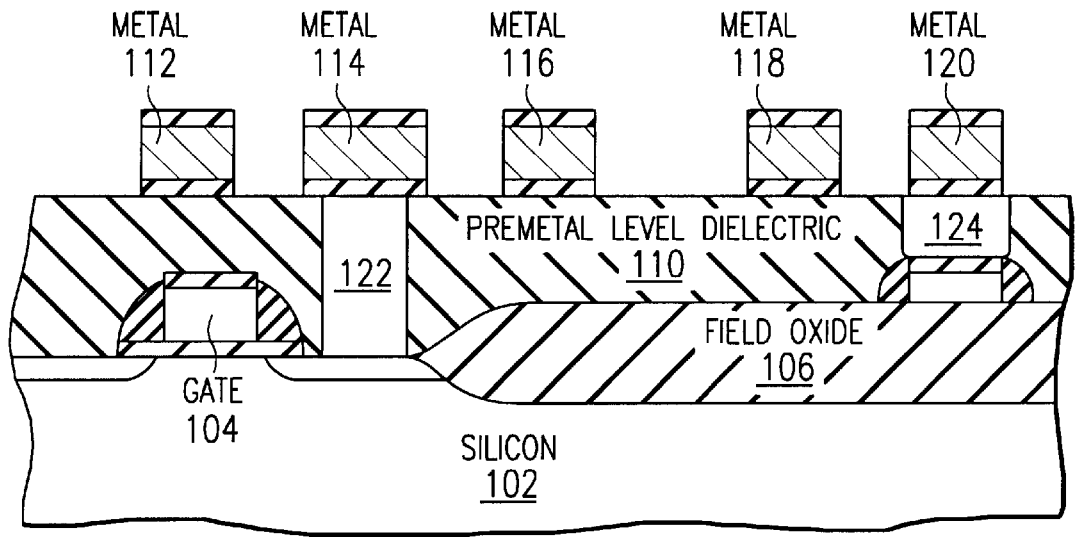
FIGS. 1a–e illustrate in cross sectional elevation views the steps of a first preferred embodiment and method.
Figure 1B:
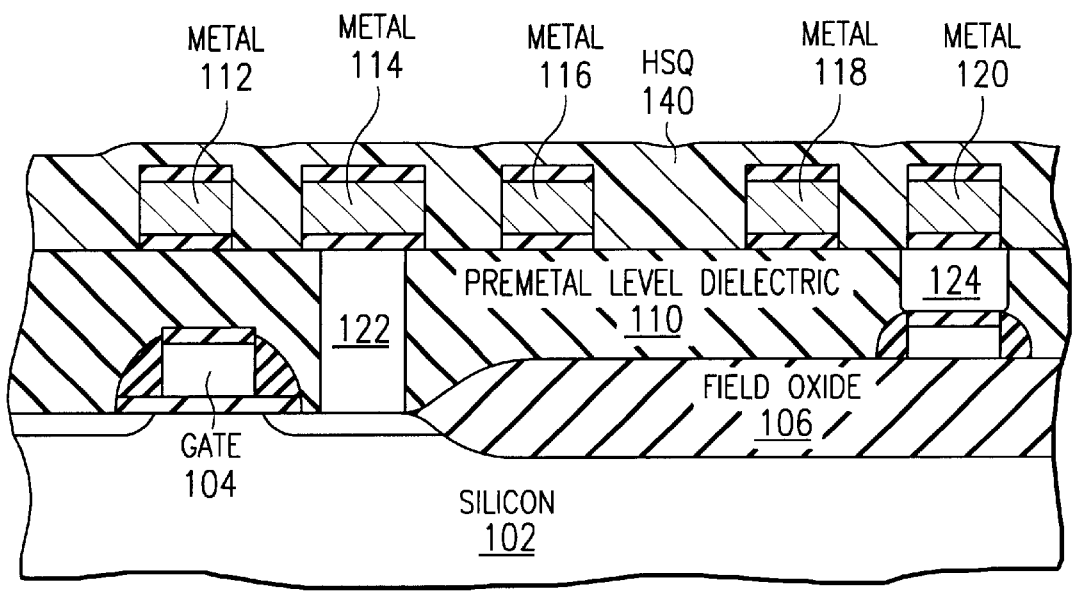
Figure 1C:
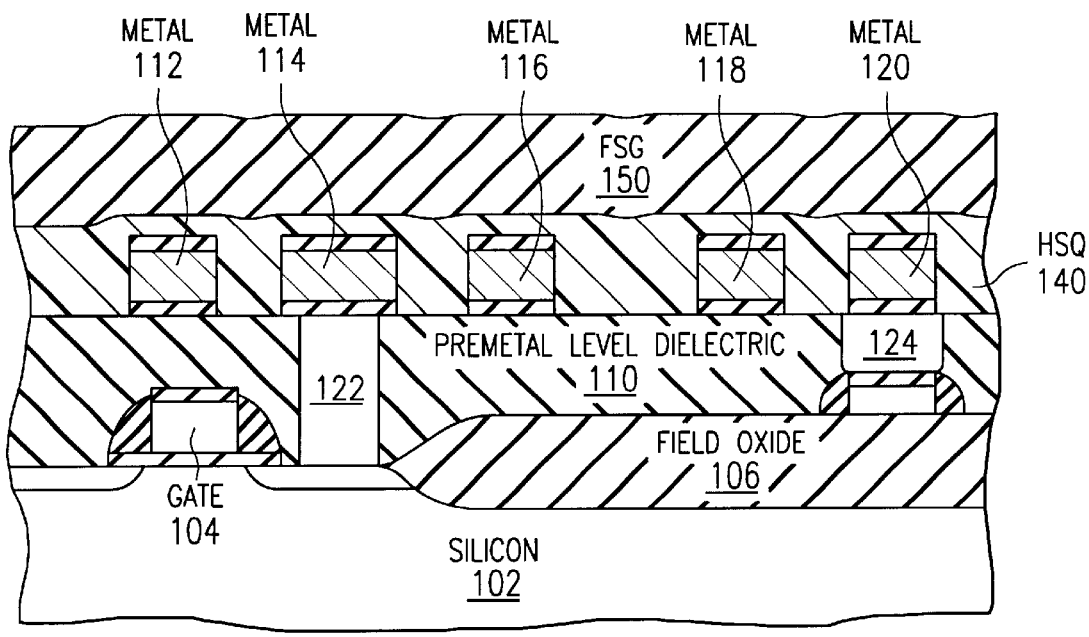

FIG. 1a–d illustrate in cross sectional elevation views the steps of a first preferred embodiment method of insulator formation between metal lines during integrated circuit fabrication. In particular, start with the partially fabricated circuit of FIG. 1a which includes polysilicon gate 104 and field oxide 106 on silicon substrate 102 and lying under premetal level dielectric (PMD) 110 (which may be silicon dioxide) with metal lines 112–120 on PMD 110 and metal filled vias 122–124 extending through PMD 110. The metal lines may be made of aluminum with TiN cladding on top and bottom. Metal lines 112–120 are 0.35–0.5 μm wide and 0.75–0.5 μm high with only 0.35–0.5 μm spacing between lines 112–116 and between lines 118–120. Of course, other heights, widths, and spacings could also be used, such as 0.25 μm wide and 0.8 μm high. Thus the dielectric constant of the insulator between the metal lines should be as small as possible to limit capacitive coupling. Also, the PMD could be a stack of a thin conformal layer of undoped oxide, a conformal layer of doped oxide (BPSG or PSG), and thick fluorinated oxide: this stack provides a lower effective dielectic constant by the use of fluorinated oxide and also provides ion getteling with the doped oxide layer; see FIG. 1e.

Spin on layer 140 of hydrogen silsesquioxane (HSQ) to an average thickness of about 0.3–0.5 μm; the thickness of HSQ layer 140 will be only about 0.05 μm over the metal lines but will fill the gaps; and over large metal structures. (e.g., capacitor plates) the thickness will be closer to the average. Cure the HSQ at about 400° C.; the HSQ has a chemical composition of roughly $[SiHO_{3/2}]_N$ in a crosslinked structure. HSQ layer 140 is thin enough to avoid cracking.

Next, deposit 0.95 μm thick fluorinated silicon oxide (FSG) layer 150 on HSQ layer 140 by plasma-enhanced deposition using a fluorinated tetraethoxysilane (fluorinated TEOS) plus oxygen source gasses. The (unbalanced) reaction is:

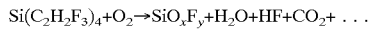

$$Si(C_2H_2F_3)_4 + O_2 \rightarrow SiO_xF_y + H_2O + HF + CO_2 + \ldots$$

Many alternative source gasses exist, such as silane, oxygen, and silicon tetrafluoride plus argon inert gas. The (unbalanced) reaction is then

$$SiH_4 + O_2 + SiF_4 \rightarrow SiO_xF_y + H_2O + HF + \ldots$$

Plasma heating increases the substrate temperature which is held at about 330° C. The source gas flows are about 30 sccm $SiH_4$, 45 sccm $O_2$, 15 sccm $SiF_4$, and 15 sccm Ar. The total pressure in the reaction chamber is about 4–5 mTorr. The fluorinated oxide deposits at about 290 nm/min and has a fluorine content of 2–6% and a dielectric constant of about 3.5; see FIG. 1c. Note that chemical mechanical polishing (CMP) can be applied to planarize the surface of fluorinated oxide 150, and another advantage of fluorinated oxide is that it polishes somewhat more rapidly than undoped oxide.

Figure 1D:
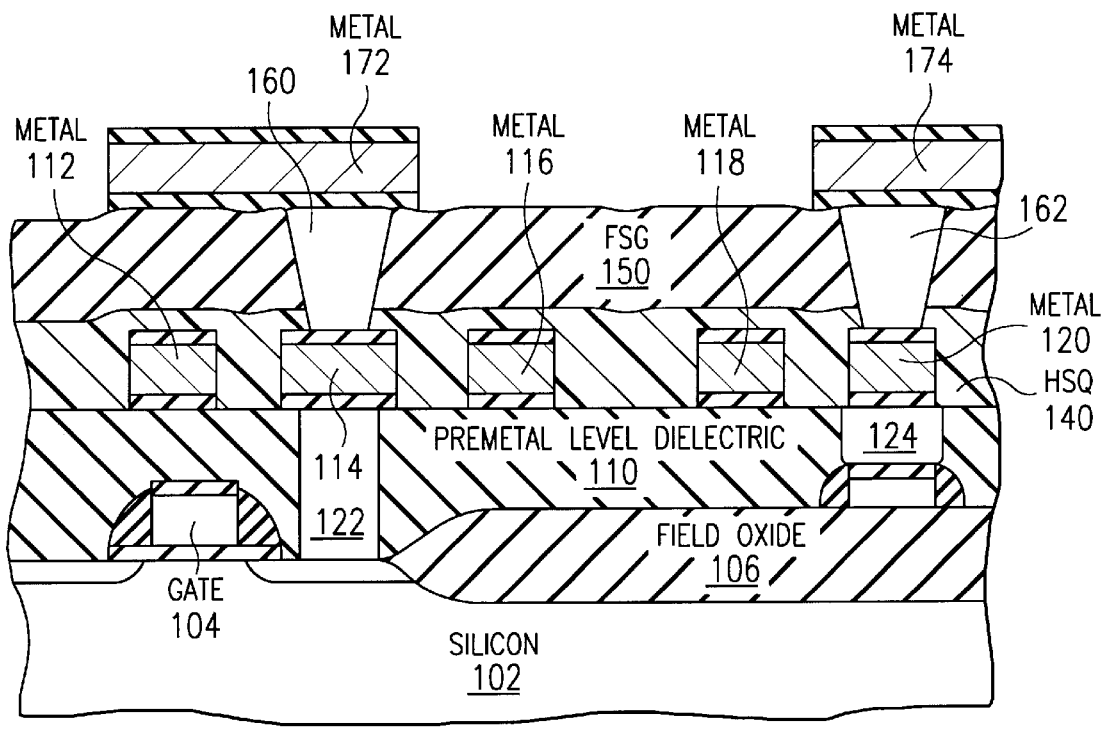
Figure 1E:
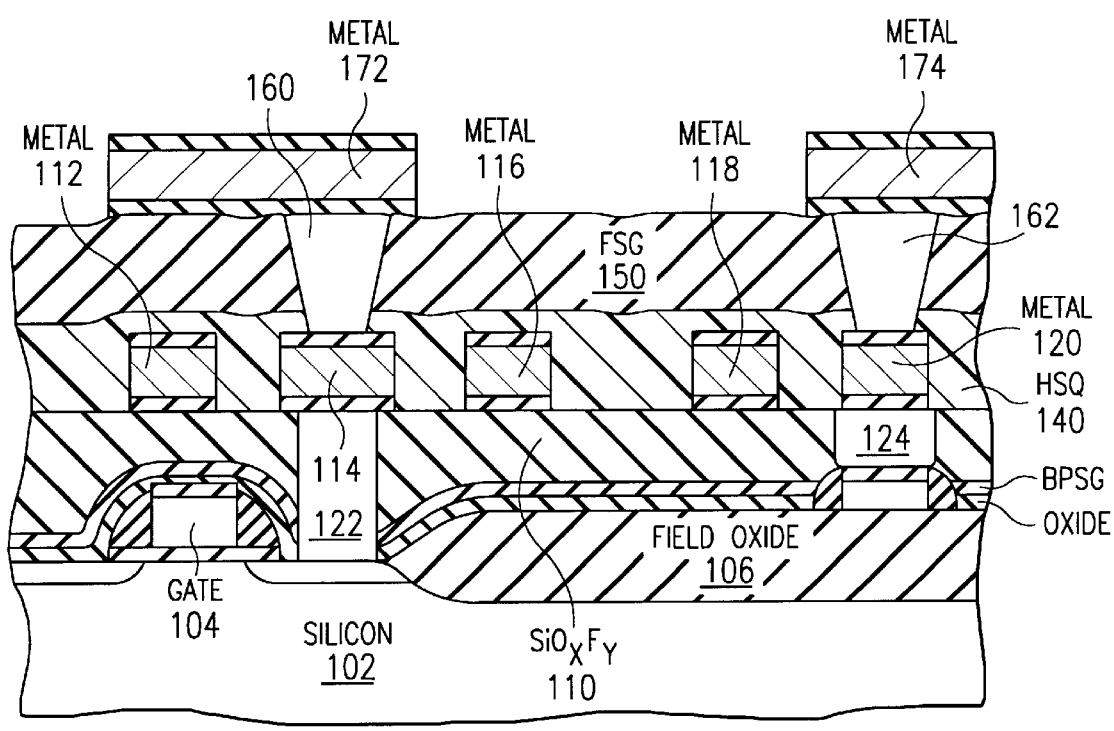
Figure 2A:
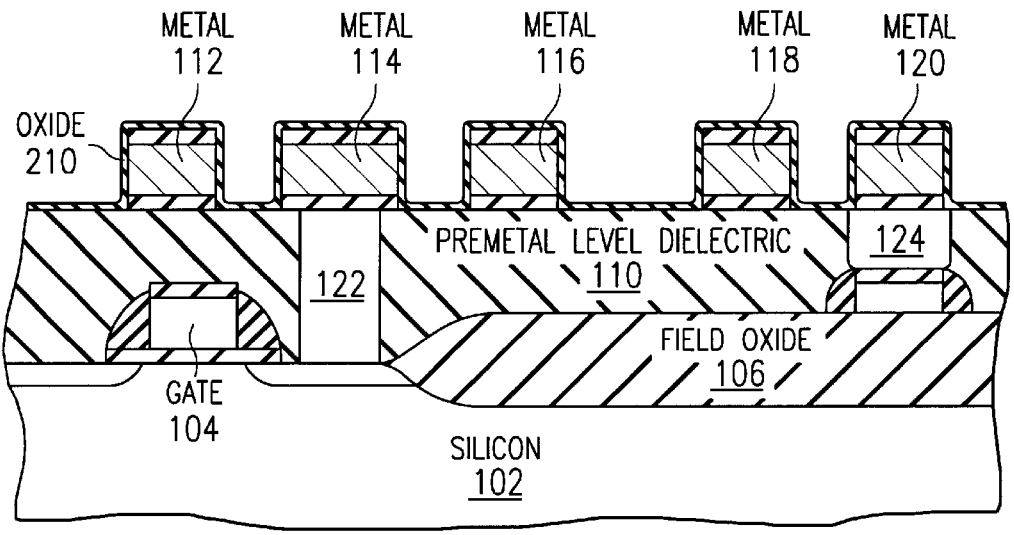
FIGS. 2a–d illustrate in cross sectional elevation views the steps of a second preferred embodiment and method.
Figure 2B:
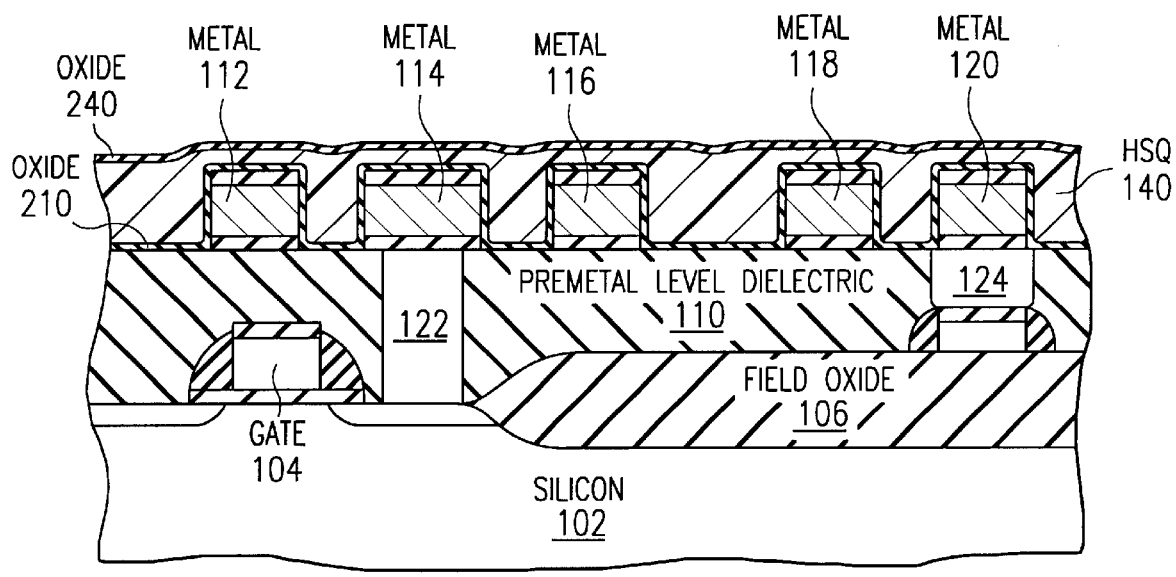
Figure 2C:
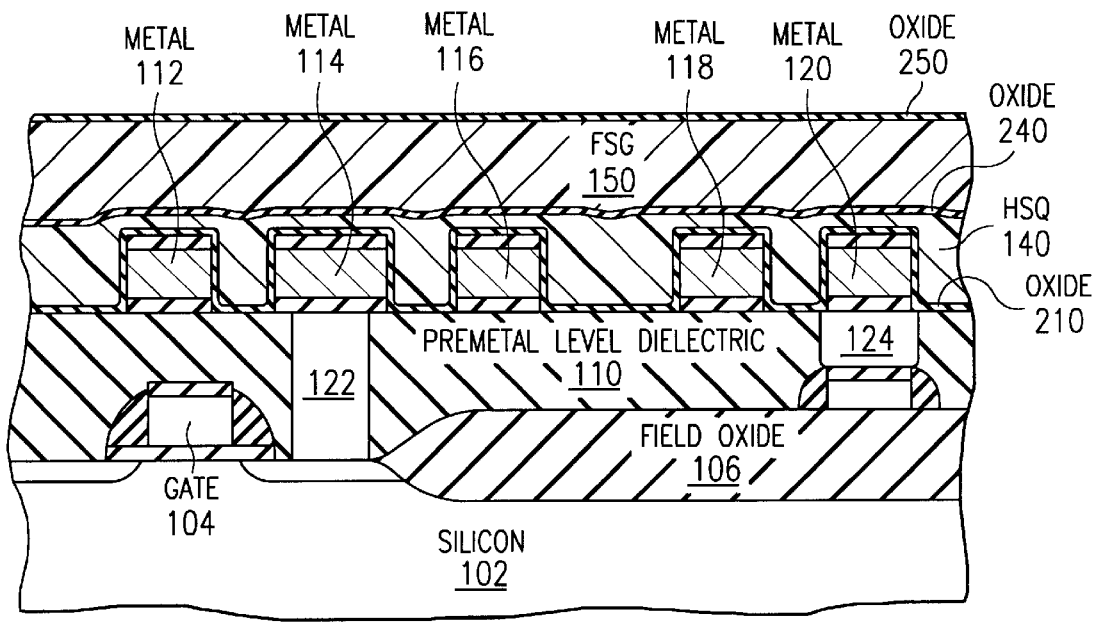
Figure 2D:
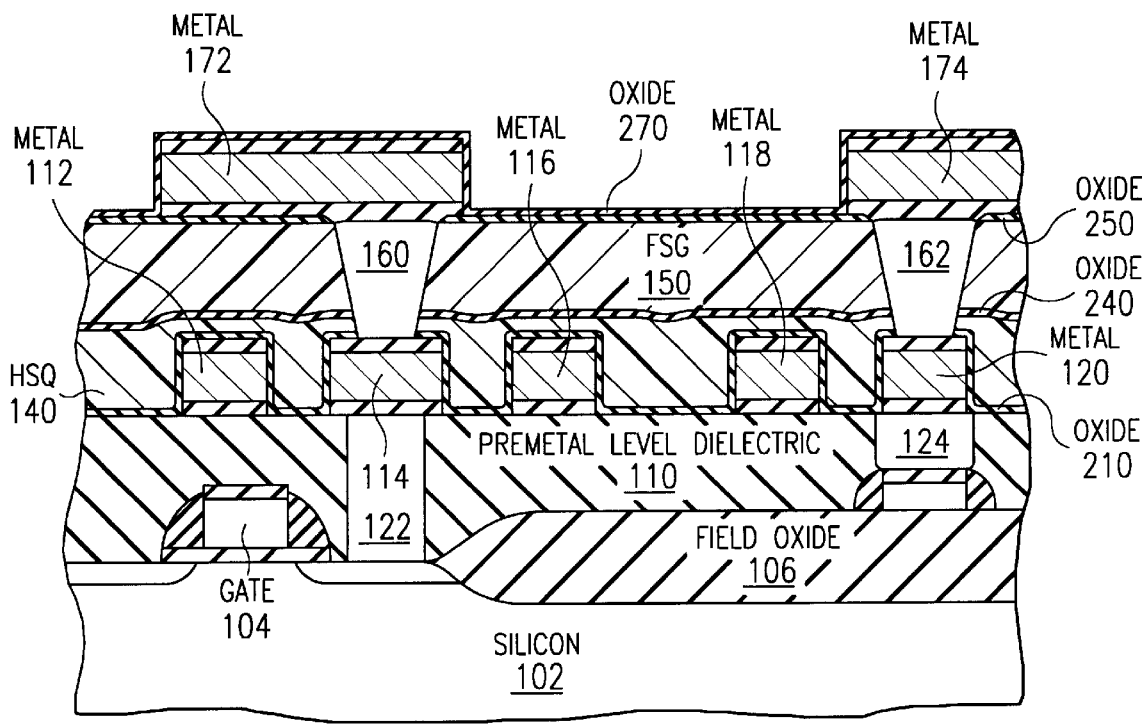

After completion of the intermetal level dielectric 140–150, photolithographically pattern and etch vias 160–162 for connection from metal lines 112–120 to an overlying metal level. Then fill the vias with metal and deposit the second level of metal. Then photolithographically patten the second level metal to form second metal level wiring 172–174 on insulator stack 140–150 and connecting by vias 160–162 to first metal level wiring. The via filling may be either a selective or a blanket chemical vapor deposition of tungsten with etchback followed by a capped aluminum layer deposition for the second metal level, or the via filling may be coincident with the second metal level deposition such as by aluminum reflow. Also, the vias may have a barrier-liner formed prior to filling: liners such as Ti, TiN, TiW may be sputtered on. See FIG. 1d illustrating the second metal level wiring 172–174. Note that the via passes primarily through fluorinated oxide 150 and not HSQ 140, and the fluorinated oxide has etch properties analogous to nonfluorinated oxide.

The use of HSQ as the gap filler and (unfluorinated) oxide as the between metal levels filler reduces the coupling capacitance between 0.5 wide um metal wirings spaced 0.5 μm apart by about 13% as compared to the coupling capacitance with (nonfluorinated) oxide as both the gap filler and the between metal levels filler. In contrast, the preferred embodiment of using HSQ gap filler together with fluorinatged oxide as the between metal level filler reduces the coupling capacitance about 22%. Thus the use of two low dielectric constant insulators provides a much better effective dielectric constant than the use of just one low dielectric constant insulator together with oxide.

Repetition of the HSQ and fluorinated oxide depositons along with via and patterned metal layers can be used for multilevel metal structures.

Liner and Separator Preferred Embodiment

FIGS. 2a–d illustrate a second preferred embodiment method for ILD fabrication which includes dielectric liners for the metal wirings and dielectric separators between the two low dielectric constant iuuulators. In particular, begin as in the first preferred embodiment with first level metal wiring 112–120 on a premetal level dielectric 110. Then conformally deposit 50–100 nm thick (nonfluorinated) oxide 210; see FIG. 2a. Oxide 210 may be deposited by PETEOS and provides a protective liner for metal wirings 112–120.

Next, spin on HSQ 140 to a thickness of about 0.5 μm to fill in the gaps between the first level metal wiring 112–120. Cure the HSQ. Then deposit a 50–100 nm thick separator layer 240 of oxide on HSQ 140; see FIG. 2b. Separator 240 provides a separating barrier between the HSQ 140 and the overlying fluorinated oxide to come; the separator prevents fluorine from diffusing into and degrading the HSQ.

Then deposit more than 1 μm of fluorinated oxide 150 and polish (CMP) the fluorinated oxide down to a thickness of 0.85 μm on separator 240; this deposition may be as previously described in the first preferred embodiment. And deposit another 50–100 nm thick separator oxide 250 on fluorinated oxide 150; see FIG. 2c. Again, separator 250 may deter diffusion of fluorine upward into the overlying meal to come.

As in the first preferred embodiment, photolithographically pattern and etch vias 160–162 through separator 250, fluorinated oxide 150, separator 240, HSQ 140, and liner 210 for connection from metal lines 112–120 to an overlying metal level. Then fill the vias with metal and deposit the second level of metal; again, the fill and second metal deposition may coincide and the vias may have liners. Next, photolithographically pattern the second level metal to form second metal level wiring 172–174 on insulator stack 140–150 with separators 240 and 250 plus liner 210 and connecting by vias 160–162 to first metal level wiring. lasty, deposit 50–100 nm Hick metal liner 270 on second level metal wiring 172–174. The deposition may be PECVD oxide; see FIG. 2d.

The steps HSQ, separator, fluorinated oxide, seprator, vias, via filing, second, metal deposition and patterning, and metal lier may be repeated to form third, fourth, fifth, et cetera levels of metal wiling with low dielectric constant insulating structures. Any one or more of the separator layers 240 and 250 and the liner layers 210 and 270 could be omitted. The separators or liners could be made of insulators such as silicon nitride, but the dielectric constant of nitride is about 7.9 so such layers must be very thin.

Insertion Preferred Embodiment

Figure 3A:
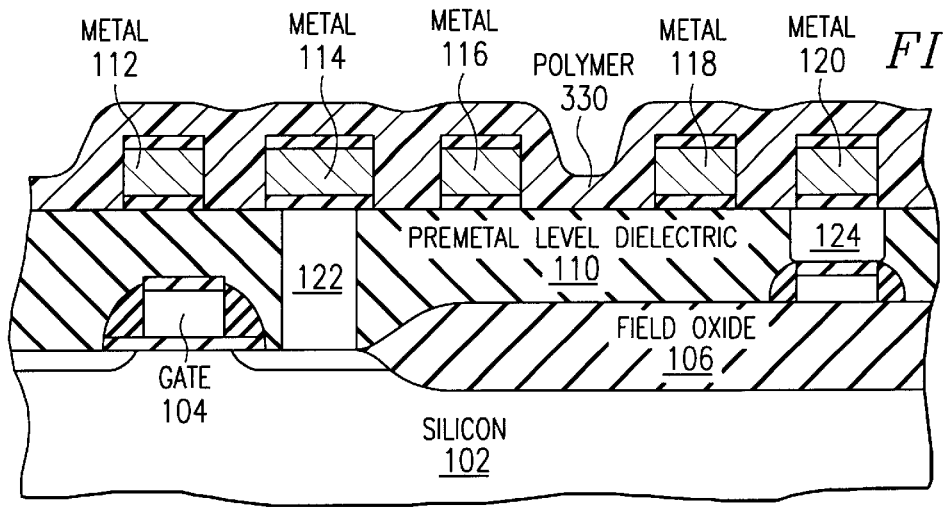
FIGS. 3a–c illustrate in cross sectional elevation views the steps of a third preferred embodiment and method.
Figure 3B:
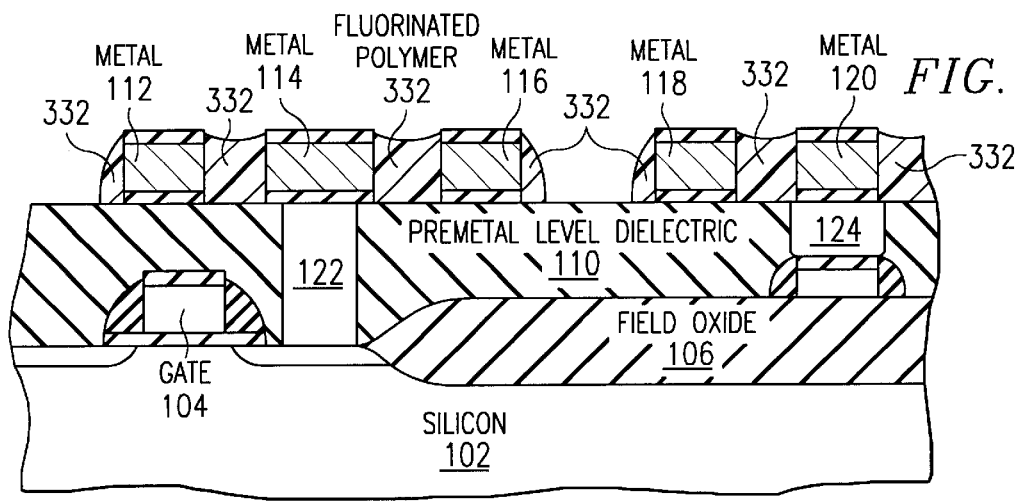
Figure 3C:
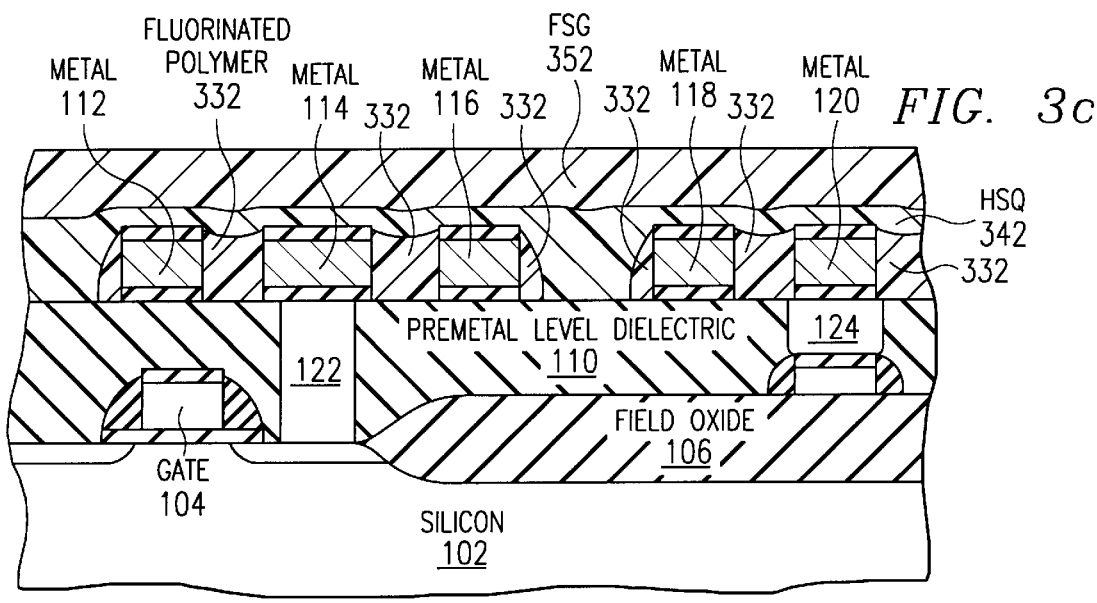

FIGS. 3a–c illustrate a third preferred embodiment low dielectric constant insulator structure method which uses three dielectrics. In particular, FIG. 3a shows two metal wiring lines 112–120 as in FIG. 1a plus a conformally deposited polymer 330 such as a parylene (polyparaxylylene) overlying the metal lines. Parylenes have very low dielectric constant: down to 2.35 for fluorinated paylenes, and can be deposited from the vapor phase from active monomers.

FIG. 3b shows the stucture after an anisotropic etch of polymer 330 to leave sidewall and minimal space filling polymer 332. Thus the adhesion to the underlying PMD and metal plus the mechanical strength of polymer 332 need not be large because it will not be the primary support material for the next layer.

Alternatively, for a polymer having sufficient adhesion and mechanical strength, the anisotropic etchback may be eliminated and the next layer, such as HSQ or fluorinated oxide or both, can be directly applied to the structure illustrated in FIG. 3a.

FIG. 3c illustrates planarizing HSQ 342 spun on to fill in between the polymer adsidewalled metal lines and fluorinated oxide (FSG) 352 deposited on HSQ 342 to provide filler up to an overlying metal level as with the first preferred embodiment. Of course, liners and separators such as in the second preferred embodiment could also be added, and the fluorinated oxide could be planaried with CMP.

The intennetal level dielectric (ILD) with polymer only as sidewall and minmal gap filler allows use of many polymers which would otherwise have limitations such as lack of mechanical strength, and the combination with HSQ and FSG keeps the effective dielectric constant low.

Polymer Preferred Embodiment

Figure 4A:
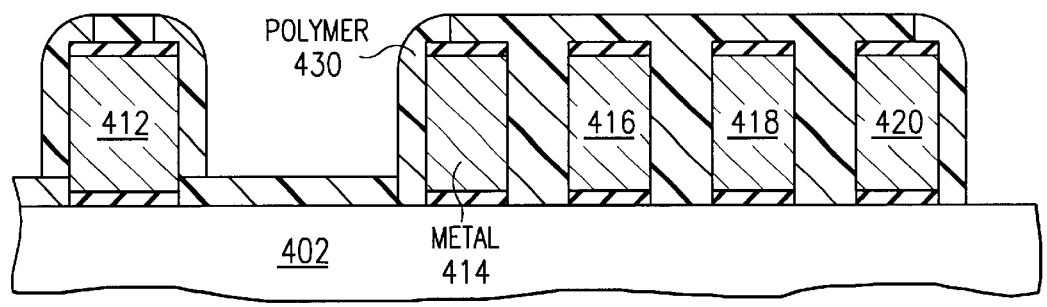
FIGS. 4a–c illustrate in cross sectional elevation views the steps of a fourth preferred embodiment and method.
Figure 4B:
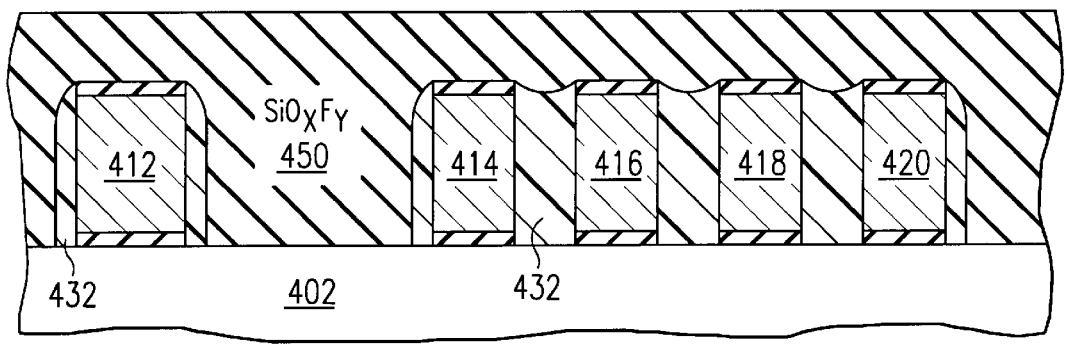
Figure 4C:
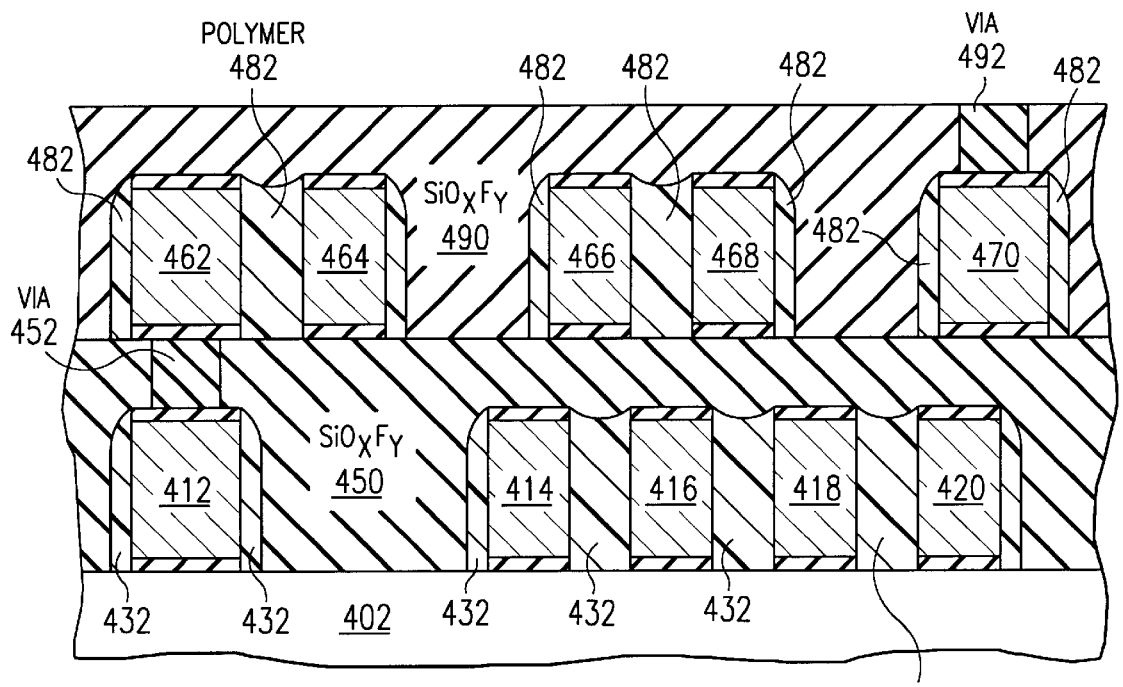

FIGS. 4a–c show two successive applications of the a simplified version of the third preferred embodiment type of ILD for two successive metal levels. In particular, FIG. 4a shows fluorinated polymer 430 conformally deposited over metal lines 412–420 on insulator 402. Metal lines 414–420 are about 0.25 $\mu$m wide and 0.7 $\mu$m high with 0.25 $\mu$m spacings, metal line 412 is about 0.4 $\mu$m wide and represents a widening of a metal line for vertical via connection. Again, the metal could be aluminum with cladding such as TiN on both the top and bottom.

FIG. 4b shows fluorinated polymer 432 etched back to fill between the closely spaced metal lines and form sidewails on the others. FIG. 4b also shows planarized fluorinated oxide 450 covering the metal lines and fluorinated polymer to a thickness of about 0.7 $\mu$m. Fluorinated oxide 450 could be plasma-enhanced deposited (source gasses fluorinated TEOS or silane plus oxygen plus silicon tetrafluoride) with simultaneous sputtering for planarization, or could use a sacrificial layer etchback or CMP for planarization.

FIG. 4c shows metal-filled via 452 connecting first level metal line 412 through fluorinated oxide 450 up to second level metal line 462 together with other second level metal lines 464–470 on fluorinated oxide 450. Etched back fluorinated polymer 482 fills in between closely spaced metal lines 462–470 and forms sidewall spacers on others, and planarized fluorinated oxide 490 covers the second level metal lines. Metal-filled via 492 connects second level metal line 470 to third level metal lines (not shown) later formed on fluorinated oxide 490. Metal-filled vias 452 and 492 may be formed by first photolithographic paterning and etching the oxide followed by filling with tungsten through either blanket deposition plus etchback or selective deposition. The metal lines are formed by blanket metal deposition followed by photolithographic patterning and anisotropic etching. Further levels can be fabricated by repetition.

Polymer Refill Preferred Embodiment

Figure 5A:
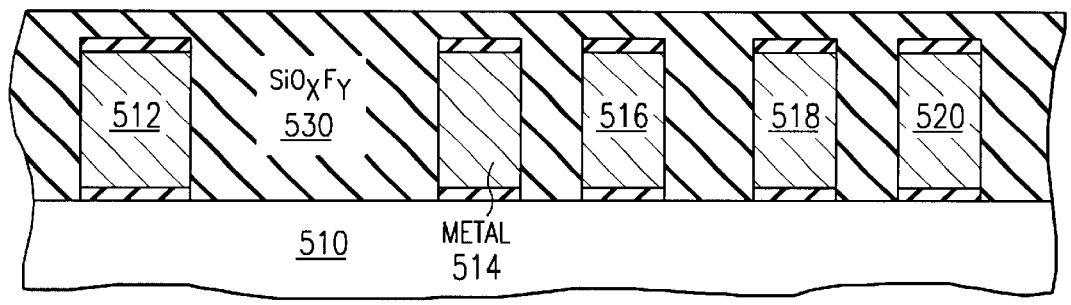
FIGS. 5a–d illustrate in cross sectional elevation views the steps of a fifth preferred embodiment and method.

FIGS. 5a–d illustrate in cross sectional elevation views two successive applications of a polymer refill preferred embodiment type of IMD for two successive metal levels. Indeed, FIG. 5a shows metal lines 512–520 on insulating layer 510 and with planarized fluorinated oxide layer 530 overlying the metal lines. Metal lines 514, 516, 518, and 520 have a minimal linewidth, about 0.25 $\mu$m wide, and a height of about 0.7 $\mu$m; whereas, metal line 512 indicates a width increase to about 0.4 $\mu$m for via alignment ease. The spacings between the metal lines in metal line pairs 514–516 and 518–520 are minimal, about 0.25 $\mu$m, but other spacings are larger. The metal lines are formed by blanket deposition followed by photolithographic pattering; the metal could be cladded aluminum.

Figure 5B:
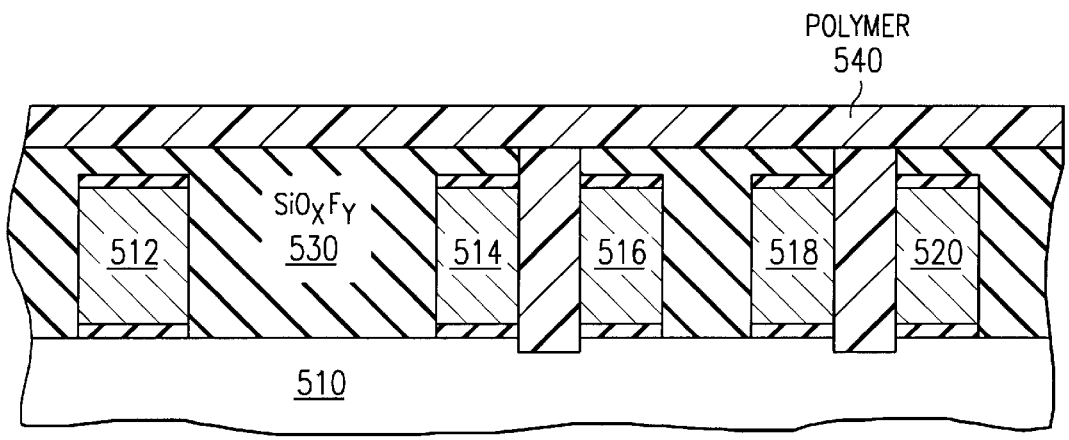

Photolithographically locate the minimal metal line spacings and etch fluorinated oxide 530 out from the minimal spacings. The etch may be an anisotropic plasma etch or could be selective with respect to the metal and use the metal lines as lateral etchstops. An overetch into the underlying insulator 510 may be used. After the fluorinated oxide etch, conformally deposit fluorinated polymer 540 as previously described; the conformal deposition to a thickness of at least 0.125 $\mu$m will fill the minimal spacings; see FIG. 5b illustrating a deposition of about 0.4 $\mu$m of polymer.

Figure 5C:
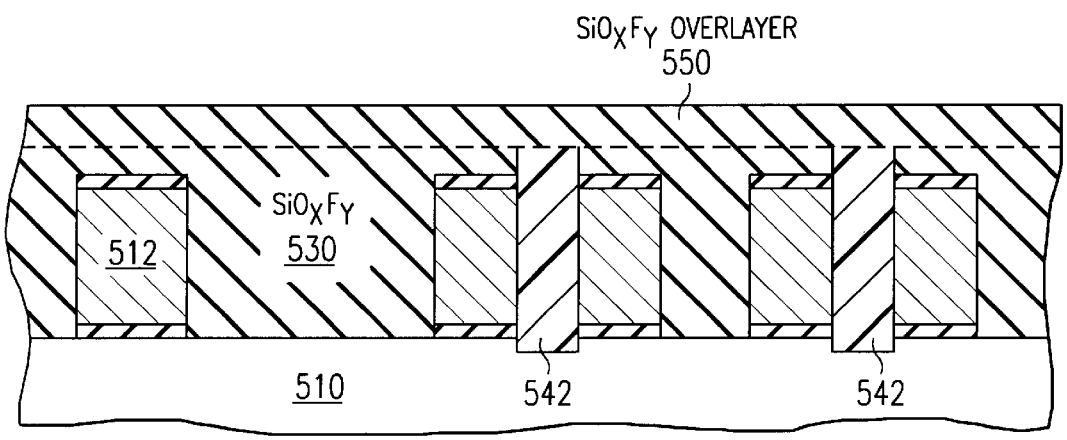
Figure 5D:
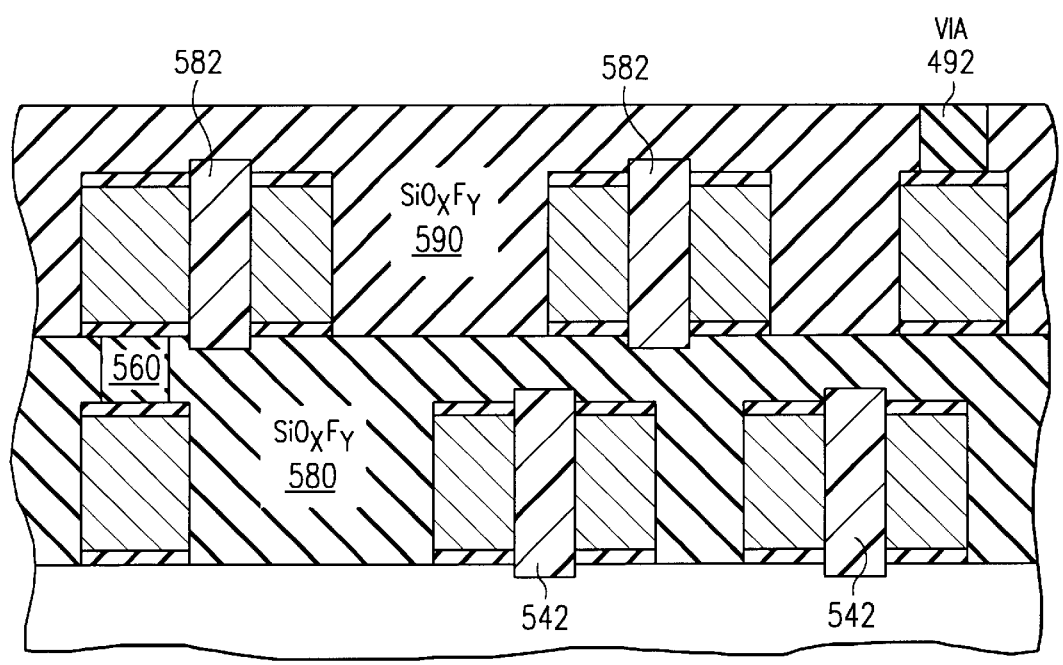

FIG. 5c shows an etchback of polymer 540 to leave only polmer fillers 542 in the minimal spacings. After the polymer etchback, deposit about 0.5 $\mu$m of fluorinated oxide 550. Fluoinated oxides 530 and 550 form a single fluorinated oxide 580.

The metal level is completed by photolithographically defining and etching vias mi fluorinated oxide 580 to the wide portions of the metal lines such as metal line 512; then fill the vias by either selective metal deposition or blanket deposition and etchback. The vias may be filled with tngsten with a barrier layer. The metal-filled vias 560 provide connection to a second metal level plus overlying fluorinated oxide 590 with refilled polymer 582 which are formed in the same manner as the metal level just described; see FIG. 5d. An alternative would be to deposit the metal which fill vias 560 and is patterned to form the second level metal lines in as a single step. This could be any conformal metal deposition method such as chemical vapor deposition or a reflow of metal such as aluminum; optionally a sputtered barrier metal layer could be initially deposited.

As previously described, liners for the metal lines and/or separators between dielectric materials could be used.

Recessed Metal Embodiment

Figure 6A:
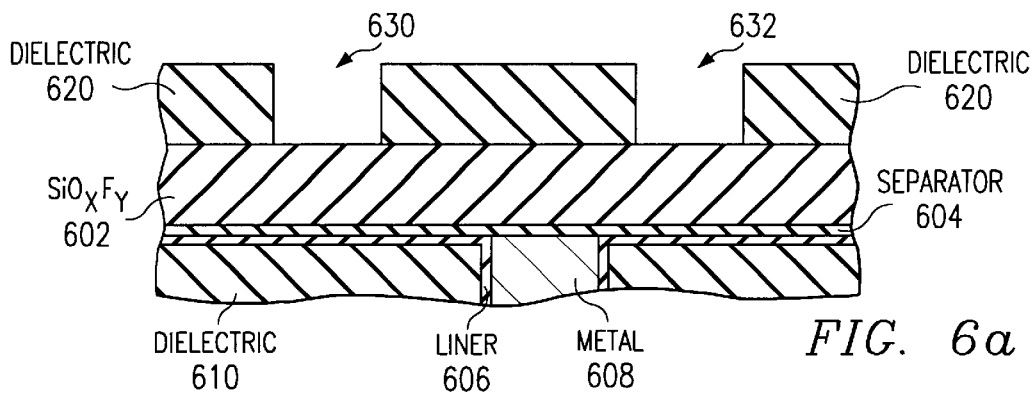
FIGS. 6a–d show in cross sectional elevation views a recessed wiring preferred embodiment and method.
Figure 6B:
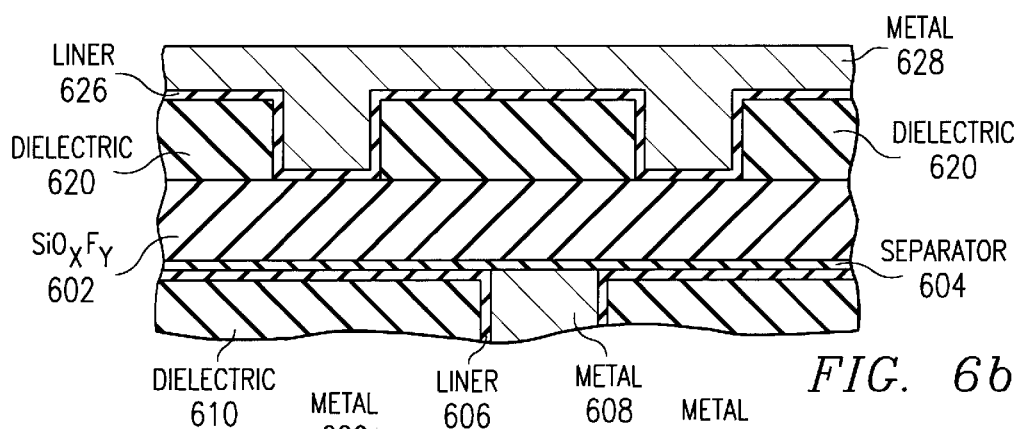
Figure 6C:
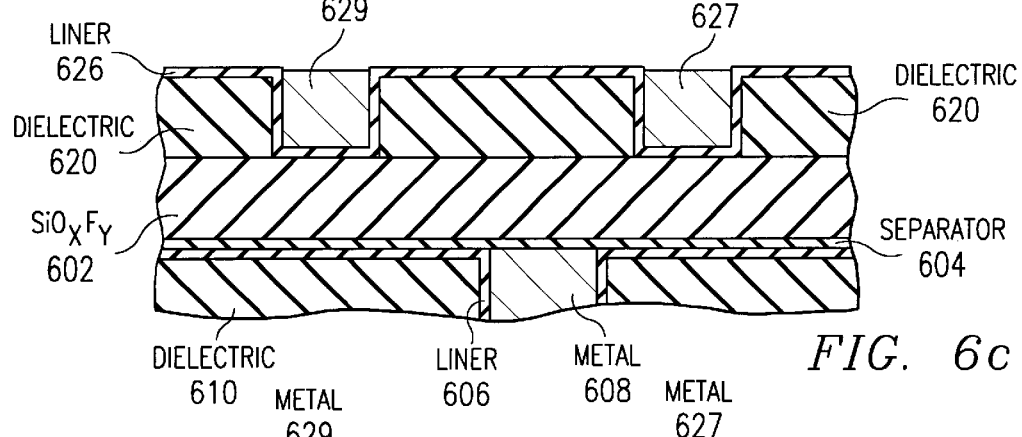

FIGS. 6a–c illustrate in cross sectional elevation views a recessed metal (Damasene) preferred embodiment IMD and method. In particular, FIG. 6a shows fluorinated oxide layer 602 as the between metal levels filler on separator layer 604 and liner layer 606 plus metal wiring line 608 which is imbedded in dielectric layer 610. Dielectric layer 620 is on fluorinated oxide 602 and wiring line grooves 630–632 have been photolithographically patterned and etched in dielectric layer 620; grooves 630–632 may be 0.3 $\mu$m wide. Separator 604 and liner 606 may be plasma enchanced deposited TEOS oxide of thickness about 10 nm; fluorinated oxide layer 602 may be 1 $\mu$m thick, and dielectric layer 620 may be 0.8 $\mu$m thick and made of a low dielectric constant material such as fluorinated oxide or cured HSQ or polymer. Also, grooves 630–632 need not extend completely through dielectric layer 620 for thicker dielectric layers.

FIG. 6b shows conformal liner layer 626 on dielectric layer 620 and in the grooves, and metal 628 deposited to fill the grooves. Metal 628 may be chemical vapor deposited or reflowed to fill the grooves. Then applied CMP planarizes away all of metal 628 outside of the grooves, leaving metal lines 627, 629 in the grooves as in FIG. 6c.

Figure 6D:
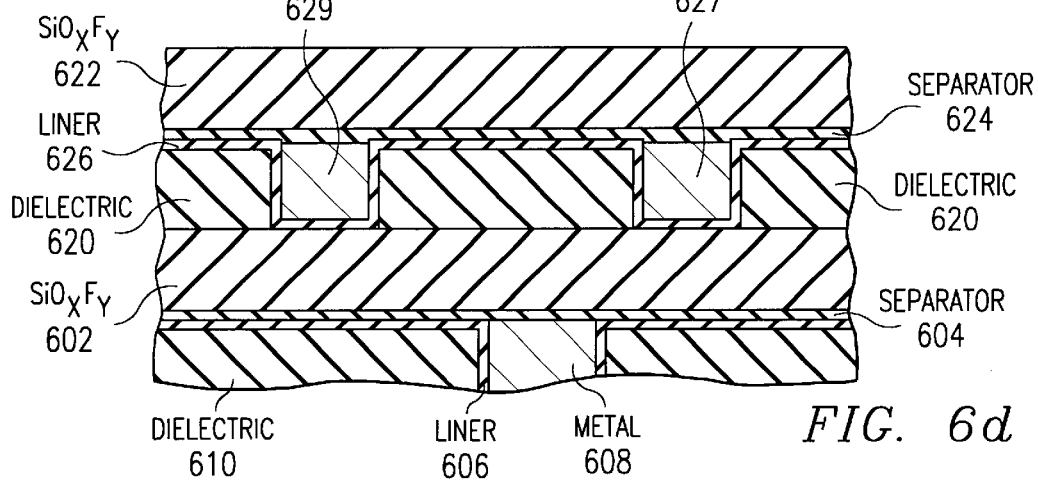

FIG. 6d illustrates separator layer 624 and the between metal levels filler fluorinated oxide layer 622 deposited on the planarized surface to complete the IMD between metal lines 627, 629 and metal lines which would be formed over fluorinated oxide 622. Again, separator layer 626 would be very thin (10 nm) and could be PETEOS, and fluorinated oxide 622 would be about 1 $\mu$m thick.

Modifications

Modifications of the preferred embodiments of two or more low dielectric constant materials for an interlevel dielectric (either PMD or IMD) can be made while retalning the low effective dielectric constant. For example, the fluorinated oxide used could have a lower or higher effective fluorine content and thus a dielectric constant of down to 3.0 or up to 3.6 or 3.7; the dimensions of the metal and polysilicon lines and the spacing between lines, both horizontal and vertical, could be varied; the number of different insulators used in between metal wiring layers could be varied and graded compositions, such as the fluorine content varying in fluorinated oxide, could be used.

Further, low dielectric constant insulator could be used as at least part of the possivation overcoat which covers a completed integrated circuit. Indeed, a first $SiO_xF_y$ layer filling the gaps between the top level metal lines with an overlying silicon nitride layer could be used, or a polymer or spinn glass gap filling plus $SiO_xF_y$ overlier plus top silicon nitride could be used.

What is claimed is:

1. An integrated circuit interlevel insulation structure, comprising:

(a) a first interconnection level having a plurality of spaced apart conductors havinp, an upper surface and a first insulator region of an electrically insulating material which is highly susceptible to cracldng as a thick fihn having a thickness sufficiergyv thin to generally avoid cracking disposed adjacent and between said plurality of spaced apart conductors and disposed over and in contact with said upper surface by up to about 0.05 micrometers, said first insulator region having a dielectric constant of less than 3.7; and (b) a second interconnection level disposed over said first interconnection level having a second planarizable electrical insulator region and said plurality of spaced apart conductors and disposed under a second conductor, said second insulator region composed of dielectric material with a dielectric constant less than 3.7 but greater than said first dielectric material and less susceptible to cracking than said first dielectric material.

2. The insulator structure of claim 1, wherein:

said first dielectric material is HSO and said second dielectric material is a fluorinated oxide.

3. The insulator structure of claim 1, further comprising:

(a) a separator layer between said first region and said second region.

4. An integrated circuit interlevel insulation structure, which comprises:

a first dielectric layer;

a pair of spaced apart electrical conductors, each having an upper surface and disposed on said first dielectric layer, said electrical conductors having a space therebetween;

a first space-filling electrically insulating material having a dielectric constant less than 3.7 and which is highly susceptible to cracking as a thick film having a thickness sufficiently thin to generally avoid cracking disposed in said space between said pair of spaced apart electrical conductors and extending over and in contact with each of said conductors by up to 0.05 micrometers;

a second planarizable electrically insulating material having a dielectric constant of less than 3.7 and greater than said first electrically insulating material and less susceptible to cracking than said first dielectric material disposed over said first electrically insulating material; and an electrically conductive layer disposed over said second electrically insulating layer and isolated from said spaced apart electrical conductors.

5. The in tegrated circuit of claim 4 wherein said fir srt dielectric layer has a dielectric constant greater than 3.7.

6. The integrated circuit of claim 4 wherein said first dielectric layer is a silicon oxide.

7. The integrated circuit of claim 4 wherein said first electrically insulating material is HSQ and said second electrically insulating material is a fluorinated silicon oxide.

8. The integrated circuit of claim 5 wherein said first electrically insulating material is HSQ and said second electrically insulating material is a fluorinated silicon oxide.

9. The integrated circuit of claim 6 wherein said first electrically insulating material is HSQ and said second electrically insulating material is a fluorinated silicon oxide.

* * * * *